United States Patent [19]

Deguchi et al.

[11] Patent Number: 5,347,178

[45] Date of Patent: Sep. 13, 1994

[54] CMOS SEMICONDUCTOR LOGIC CIRCUIT WITH MULTIPLE INPUT GATES

[75] Inventors: Mitsuhiro Deguchi; Michio Komoda, both of Itami, Japan

[73] Assignee: Mitsubishi Denki Kaisha Kitaitami Seisakusho, Itami, Japan

[21] Appl. No.: 7,148

[22] Filed: Jan. 21, 1993

[30] Foreign Application Priority Data

Jan. 23, 1992 [JP] Japan .................................. 4-009861

[51] Int. Cl.⁵ .................. H03K 19/092; H03K 19/094
[52] U.S. Cl. ...................................... 307/451; 307/475
[58] Field of Search ................................ 307/451, 475

[56] References Cited

U.S. PATENT DOCUMENTS

| | | | |
|---|---|---|---|
| 3,911,289 | 10/1975 | Takemoto | 307/451 |
| 4,091,293 | 5/1978 | Ando | 307/451 |
| 4,710,648 | 12/1987 | Hanamura et al. | 307/451 |

FOREIGN PATENT DOCUMENTS

| | | |
|---|---|---|
| 0101896 | 7/1984 | European Pat. Off. . |
| 59-23924 | 2/1984 | Japan . |
| 59-127424 | 7/1984 | Japan . |
| 2125518 | 5/1990 | Japan . |
| 2309815 | 12/1990 | Japan . |
| 3085919 | 4/1991 | Japan . |

*Primary Examiner*—Edward P. Westin
*Assistant Examiner*—Richard Roseen
*Attorney, Agent, or Firm*—Herbert F. Ruschmann

[57] ABSTRACT

A semiconductor logic circuit includes a number of gate circuits and a voltage supply. Each of the gate circuits includes a series circuit comprising the same number of transistors of one conductivity type connected in series, and a parallel circuit comprising the same number of transistors of a different conductivity type connected in parallel. The series and parallel circuits are connected in series between a voltage supply and ground. The semiconductor logic circuit includes the same number of input pins, and an output pin connected in common to all of the gate circuits. Each of the input pins is connected to a different one of the transistors in the series circuit and to a different one of the transistors in the parallel circuit of each of the gate circuits. The control electrode of the k-th transistor from the end of each series circuit closer to the voltage supply is connected to a different one of the input pins, and the control electrode of the m-th transistor from the end of each parallel circuit closer to the input pins is connected to a different one of the input pins.

25 Claims, 5 Drawing Sheets

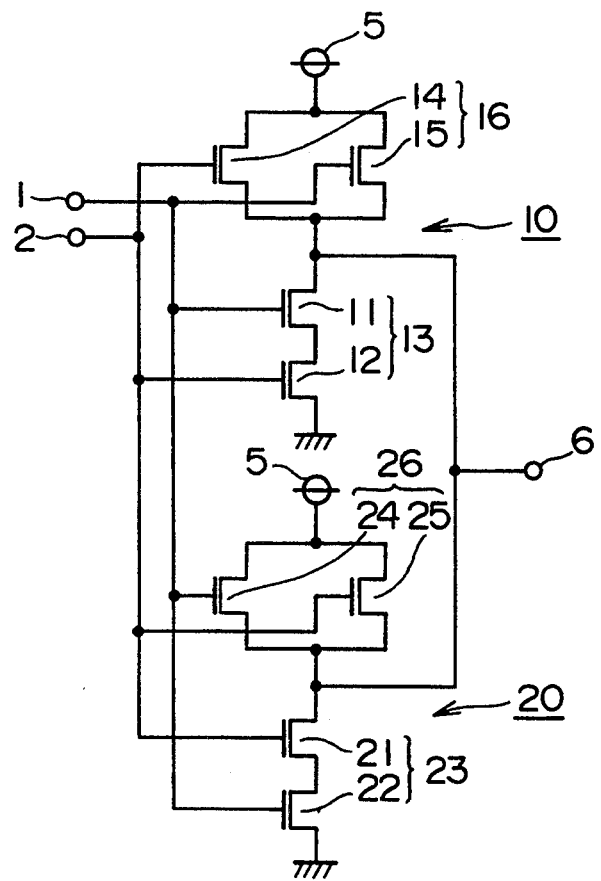
F I G. 7
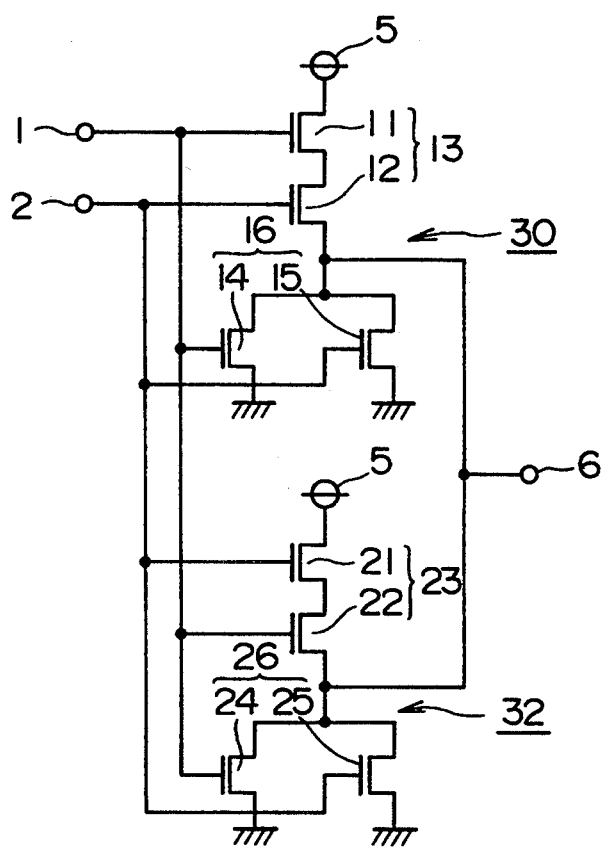
F I G. 8

CMOS SEMICONDUCTOR LOGIC CIRCUIT WITH MULTIPLE INPUT GATES

The present invention relates to a logic circuit formed on a gate array integrated circuit having rows of first conductivity type transistors alternating with rows of second conductivity type transistors and, in particular, to a multiple-input gate circuit including series combinations of a plurality of transistors of the same conductivity type, the gate electrodes of which are connected to different input pins.

BACKGROUND OF THE INVENTION

Japanese Unexamined Patent Publication No. SHO 59-23924 discloses a dual-input gate circuit. The dual-input gate circuit of this Japanese publication is shown in FIG. 1. The circuit comprises a series circuit 13 including transistors 11 and 12 of a first conductivity type, and a parallel circuit 16 including transistors 14 and 15 of a second conductivity type. Series circuit 13 and parallel circuit 16 are connected in series between a voltage supply 5 and ground. The gate electrodes of transistors 11 and 14 are connected to an input pin 1, and the gate electrodes of transistors 12 and 15 are connected to an input pin 2. An output pin 6 is connected to the junction between circuits 13 and 16.

The above-cited Japanese Unexamined Patent Publication No. SHO 59-23924 shows another dual-input gate circuit. As shown in FIG. 3, this dual input gate circuit comprises the same circuit as the one shown in FIG. 1, except that another series circuit 19, including transistors 17 and 18, is connected in parallel with series circuit 13. The gate electrode of transistor 17 is connected to input pin 2, and the gate electrode of transistor 18 is connected to input pin 1.

In the circuit shown in FIG. 1, let it be assumed that the supply voltage is +5 V, and transistors 11 and 12 become non-conductive when the voltage at their gate electrodes are 0 volts, and become conductive when their gate voltage is +5 V. On the other hand, transistors 14 and 15 become conductive when the gate voltage is 0 V, and become non-conductive when the gate voltage is +5 V.

First, it is assumed that the voltage at input pin 1 is 0 V, and that the voltage at input pin 2 is +5 V. Then, transistors 11 and 15 are non-conductive, while transistors 12 and 14 are conductive. As a result, a voltage equal to the supply voltage is developed across transistor 11, and the voltage at output pin 6 becomes +5 V.

Next, assume that the voltage at input pin 1 changes to +5 V, with input pin 5 being maintained at +5 V. This renders transistors 11 and 14 conductive and non-conductive, respectively. A voltage equal to the supply voltage is developed across transistors 14 and 15, and the voltage at output pin 6 becomes 0 V.

Conversely, if input pin 1 is at +5 V and input pin 2 is at 0 V, transistors 11 and 15 are conductive, while transistors 12 and 14 are non-conductive. Output pin 6 is then at +5 V.

If the voltage at input pin 2 is changed to +5 V, while maintaining the voltage at input pin 2 at +5 V, transistors 12 and 15 are rendered conductive and non-conductive, respectively. The result is that a voltage equal to the supply voltage appears across transistors 14 and 15, and output pin 6 assumes 0 V.

As explained above, when the voltage at either of input pins 1 and 2 changes from 0 V to +5 V, the voltage at output pin 6 changes from +5 V to 0 V. A problem is that the response time of the voltage change at output pin 6 when the voltage at input pin 1 changes is different from the response time when the voltage at input pin 2 changes, as described below.

When input pin 1 is at 0 V and input pin 2 is at +5 V, transistor 12 is conductive so that the end of transistor 11 connected to transistor 12 is at the ground potential or 0 V. Accordingly, when the voltage at input pin 1 changes to +5 V, it takes only a short time for the end of transistor 11 connected to output pin 6 to assume the ground potential, since only transistor 11 intervenes between output pin 6 and a connection to ground via conductive transistor 12. Conversely, when input pin 1 is at +5 V and input pin 2 is at 0 V, transistor 12 is non-conductive and, therefore, the ground end of transistor 12 is at the ground potential. Since two transistors 11 and 12 intervene, it takes a longer for output pin 6 to assume the ground potential when the voltage at input pin 2 changes to +5 V.

FIG. 3 shows a circuit which can eliminate the above-described defect and align the output response times, as proposed in Japanese Unexamined Patent Publication No. SHO 59-23924. The same reference numerals denote the same components used in the circuit shown in FIG. 1. A series circuit 19 comprising transistors 17 and 18 having the same characteristics as transistors 11 and 12 is connected in parallel with series circuit 13, with the gate electrode of transistor 17 being connected to input pin 2 and with the gate electrode of transistor 18 being connected to input pin 1.

In operation, when input pin 1 is at 0 V and input pin 2 is at +5 V, transistor 11 of circuit 13 and transistor 18 of circuit 19 which is connected to the ground potential are non-conductive. When input pin 1 is at +5 V and input pin 2 is at 0 V, transistor 12 of circuit 13 which is connected to the ground potential and transistor 17 of circuit 19 are cut off. Thus, for both input pin voltage conditions, the operating conditions of the circuit of FIG. 3 are the same and, therefore, difference between the output responses encountered in the circuit of FIG. 1 can be eliminated.

However, there is a problem in the circuit shown in FIG. 3. That is, when the circuit of FIG. 3 is implemented in a gate array integrated circuit form, transistors in the integrated circuit are not efficiently used. The circuit of FIG. 1 may be implemented by transistors arranged as shown in FIG. 2. In FIG. 2, rows of transistors 100 and 102 of one conductivity type alternate with rows of transistors 101 and 103 of opposite conductivity type. Four transistors shown in FIG. 1 are within an area 105 indicated by a broken-line rectangle in FIG. 2, in which transistors 11 and 12 are in row 101 and transistors 14 and 15 are in row 102.

On the other hand, the transistors of the circuit of FIG. 3 may be arranged in the gate array integrated circuit, as shown in FIG. 4, in which four transistors 11, 12, 17 and 18 are in row 101 and only two transistors in row 102 are used, as transistors 14 and 15. As a result, transistors 24 and 25 adjacent to transistors 17 and 18 within a rectangular area 106 indicated by broken lines in FIG. 4 cannot be used for other purpose they are wasted.

Another problem is that in both of the circuits shown in FIGS. 1 and 3, the internal impedance viewed from output pin 6 when either input pin 1 or 2 is at 0 V is relatively high, because it is dependent on the internal resistance of one of transistors 14 and 15. Accordingly, these circuits are not suitable for driving a load of large current capacity.

In view of the above-described disadvantages of the prior art circuits, an object of the present invention is to provide a semiconductor logic circuit which is free of difference in response time of output voltage at an output pin with respect to voltage changes at input pins, has a reduced internal impedance viewed from the output pin, and has increased device utilization efficiency.

SUMMARY OF THE INVENTION

A semiconductor logic circuit according to the present invention comprises n n-input gate circuits each including a series circuit of n transistors of a first conductivity type, and n transistors of a conductivity type different from the first conductivity type connected outside the series circuit, where n is greater than unity (1). The semiconductor logic circuit further includes n input pins each connected to the control electrode of a different one of the transistors in each series circuit, and also an output pin connected to all of said n-input gate circuits. The semiconductor logic circuit according to the present invention is characterized in that the control electrode of the k-th transistor in each series circuit from the end of that series circuit closer to the voltage supply is connected to a different one of the input pins, where k is an integer of from 1 to n.

In a typical embodiment of the present invention, n transistors are provided outside each series circuit with which they are connected in parallel, and the parallel circuit is connected in series with the associated series circuit between the power supply and ground. Each of the n input pins is also connected to the control electrodes of different ones of transistors in the respective parallel circuits, and the control electrode of the m-th transistor in each parallel circuit from the end of that parallel circuit closer to the input pins is connected to a different one of the input pins, where m is an integer of from 1 to n.

Incidentally, in this application, the ordinal numbers, such as "first", "second" and "third", used for transistors in the series circuits denote the order of transistors from the end of the series circuits closer to the voltage supply. Similarly, the ordinal numbers used for transistors in the parallel circuits denote the order of transistors from the end of the parallel circuits closer to the input pins.

According to one special embodiment of the present invention, a semiconductor logic circuit comprises two three-input gate circuits each including a series circuit of three transistors, namely, first, second and third transistors from the power supply side, and three input pins, namely, first, second, and third input pins. The first input pin is connected to the control electrode of the first transistor of the series circuit in a first one of the two three-input gate circuits and also to the control electrode of the third transistor of the series circuit of a second one of the two three-input gate circuits. The second input pin is connected to the control electrodes of the second transistors of the series circuits of the first and second three-input gate circuits. The third input pin is connected to the control electrode of the third transistor of the series circuit of the first three-input gate circuit and to the control electrode of the first transistor of the series circuit of the second three-input gate circuit.

Typical embodiments of the invention are considered. First, let it be assumed that n is equal to 2. The relation between two series circuits and two input pins is the same as the one of the prior art circuit shown in FIG. 3. However, since the same number of transistors in each series circuit can be used in an associated parallel circuit, the internal impedance viewed from the output pin side can be reduced, and, in addition, the efficiency of utilization of transistors on a substrate can be increased.

When n=3, a first input pin is connected to the control electrode of the first transistor of a first series circuit, to the control electrode of the second transistor of a second series circuit, and to the control electrode of the third transistor of a third series circuit. A second input pin is connected to the the control electrode of the second transistor of the first series circuit, to the control electrode of the third transistor of the second series circuit, and to the control electrode of the first transistor of the third series circuit. A third input pin is connected to the control electrode of the third transistor of the first series circuit, to the control electrode of the first transistor of the second series circuit, and to the control electrode of the second transistor of the third series circuit. Thus, each input pin is connected to all of first, second and third transistors which respectively belong to different series circuit. Therefore, the circuit conditions are equalized for the respective input pins. Thus, equal response characteristics are obtained for voltage changes at the respective input pins.

The same relationship can exist between input pins and transistors forming series circuits when n is greater than 3, such that the output responses to voltage changes at the respective input pins can be aligned. Furthermore, regardless of the number n, the number of transistors forming each series circuit is equal to the number of transistors forming an associated parallel circuit. The internal impedance when viewed from the output pin is thus low. In addition, the transistor utilization factor is high.

In aforementioned special case in which two three-input gate circuits, each having a series circuit of three transistors are used, the difference in response time of the output voltage to voltage changes at the input pins is significant between voltage changes at the input pins connected to the first and third transistors of the respective series circuits, but is relatively small between voltage changes at the input pins connected to the first and second or second and third transistors of the respective series circuits. The responses of the output voltage to voltage changes at the first and third input pins can be aligned, as in the case of n=2, and the output response to voltage changes at the second input pin does not largely differ from them. Thus, differences in output response to voltage changes at the three input pins can be minimized.

BRIEF DESCRIPTION OF THE DRAWINGS

FIG. 7 shows a semiconductor logic circuit according to the present invention which also comprises two dual-input gate circuits similar to the ones shown in FIG. 5.

FIG. 8 shows a semiconductor logic circuit according to another embodiment of the present invention, in which the positions of the series circuit and the parallel circuit in each dual-input gate circuit shown in FIG. 5 or 7 are reversed.

DESCRIPTION OF EMBODIMENTS

Figure 1:
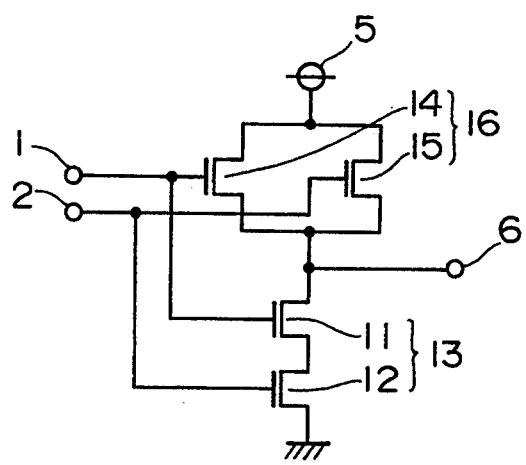
FIG. 1 shows a circuit diagram of a conventional two-input gate circuits comprising a series combination of a series circuit of two transistors and a parallel circuit of two transistors.
Figure 2:
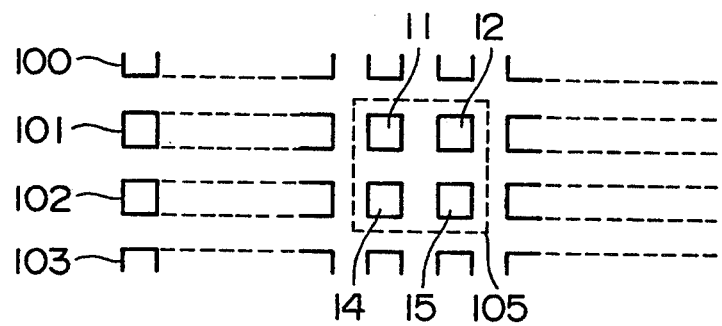
FIG. 2 is a layout of the transistors of the two-input gate circuits of FIG. 1 on a gate array integrated circuit substrate.
Figure 3:
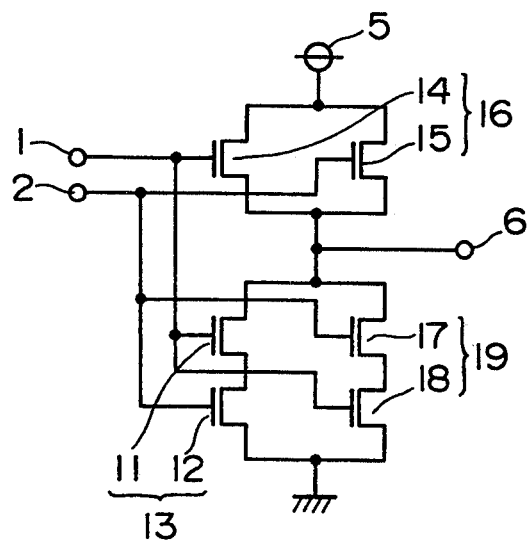
FIG. 3 is a circuit diagram of another example of conventional two-input gate circuit which includes a parallel combination of two series circuits each comprising two transistors.
Figure 5:
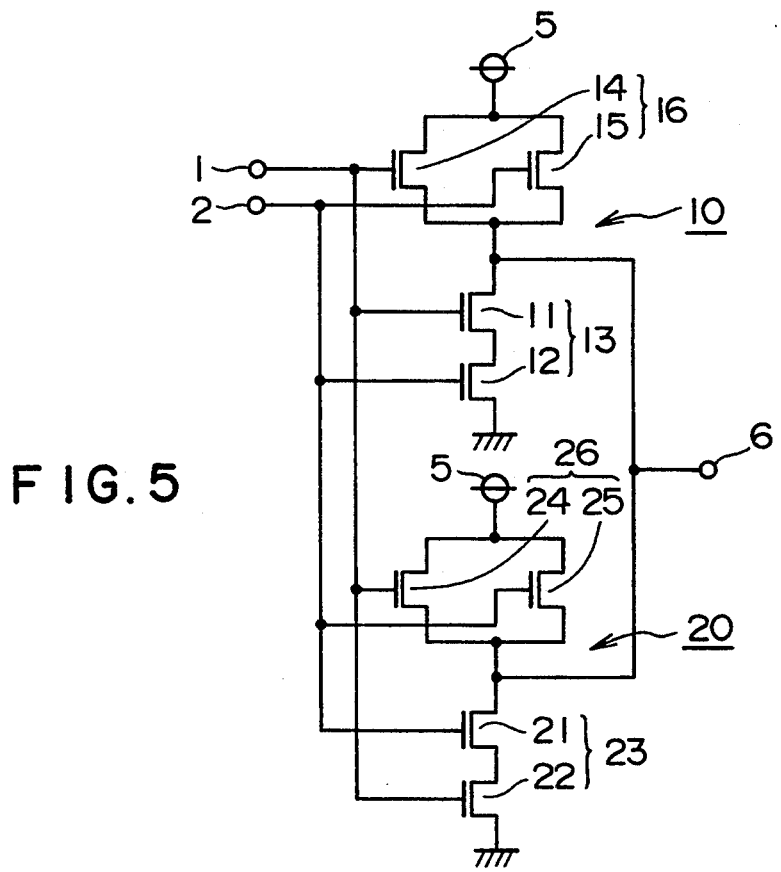
FIG. 5 shows a semiconductor logic circuit according to one embodiment of the present invention which comprises two two-input gate circuits each including a series circuit of two transistors and a parallel circuit of two transistors.

Referring to FIG. 5, a semiconductor logic circuit according to one embodiment comprises N-channel MOS transistors 11, 12, 21 and 22. N-channel transistors 11 and 12 form a series circuit 13, and N-channel transistors 21 and 22 form another series circuit 23. P-channel transistors 14 and 15 form a parallel circuit 16, and P-channel transistors 24 and 25 form another parallel circuit 26. Series circuit 13 and parallel circuit 16 are connected in series with a power supply 5 and ground, to thereby form a dual-input gate circuit 10. Similarly, series circuit 23 and parallel circuit 26 are connected in series between power supply and ground, to thereby form a dual-input gate circuit 20. The configuration and operation of each of dual-input gate circuits 10 and 20 are the same as those of the prior art circuit shown in FIG. 1.

In the circuit shown in FIG. 5, the gate electrodes of transistors 11, 14, 22 and 24 are connected to an input pin 1, and the gate electrodes of transistors 12, 15, 21 and 25 are connected to an input pin 2. The junction of circuits 13 and 16 and the junction of circuits 23 and 26 are connected in common to an output pin 6.

Figure 6:
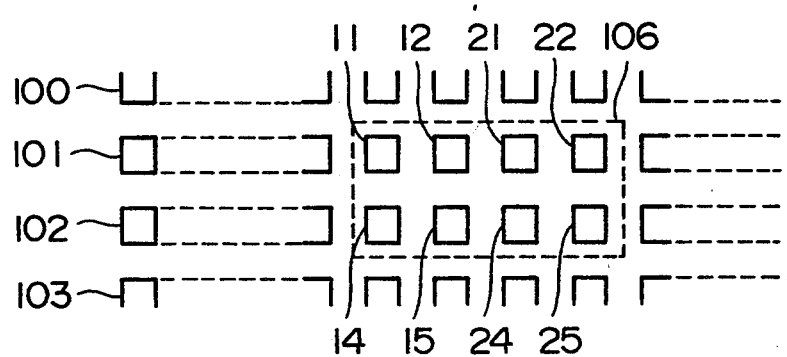
FIG. 6 shows a layout of the transistors of FIG. 5 on a gate array integrated circuit substrate.

FIG. 6 shows a layout of the transistors used in the circuit of FIG. 5 on a gate array integrated circuit chip. N-channel MOS transistors 11, 12, 21 and 22 are in a row 101 of N-channel MOS transistors, and P-channel MOS transistors 14, 15, 24 and 25 are in a row 102 of a different conductivity type transistors, namely, P-channel transistors. Like this, all of the transistors within an area indicated by a broken-line rectangle 106 are effectively utilized.

The circuit shown in FIG. 5 is considered in detail. In gate circuit 10, transistor 11 in series circuit 13, which is closer to voltage supply 5 is connected input pin 1, while transistor 12, which is more remote from voltage supply 5 is connected to input pin 2. On the other hand, in gate circuit 20, transistor 22 of series circuit 23, which is more remote from voltage supply 5 is connected to input pin 1, and transistor 21, which is closer to voltage supply 5 is connected to input pin 2.

Figure 4:
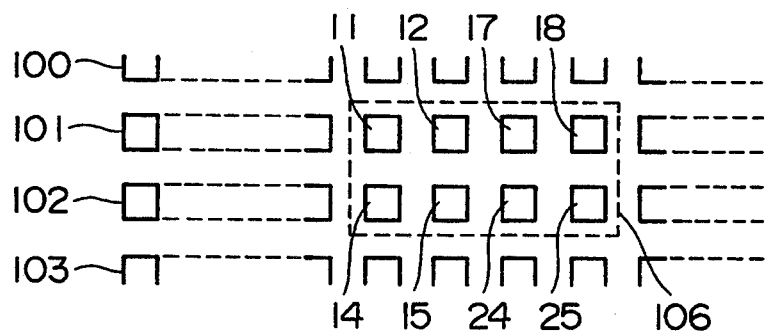
FIG. 4 shows a layout of the transistors of the two-input gate circuit of FIG. 3 on a gate array integrated circuit substrate.

With this circuit arrangement, the operating conditions of series circuits 13 and 23 for input signals applied to input pins 1 and 2, respectively, can be equalized. Furthermore, since parallel circuits 16 and 26 are connected in parallel between output pin 6 and voltage supply 5, the circuit impedance viewed from output pin 6 is reduced to one half the impedance exhibited when only one such parallel circuit is used as in the prior art circuit shown in FIG. 4.

The circuit shown in FIG. 7 is similar to the circuit shown in FIG. 5, except for the connection of input pins 1 and 2 to the transistors of parallel circuits 16 and 26. Input pin 1 is connected to transistor 15 of parallel circuit 16, which is shown remote from input pin 1, and to transistor 24 of parallel circuit 26, which is shown closer to input pin 1. Input pin 2 is connected to transistor 14 of parallel circuit 16, which is shown closer to input pin 2, and to transistor 25 of parallel circuit 26, which is shown remote from input pin 2. With this circuit arrangement, in addition to compensating for the difference in operating conditions caused by the difference in the connection between input pins 1 and 2, and transistors in series circuits 16 and 26 present in the prior art circuit shown in FIG. 1, the difference in magnitude of input impedances caused by the difference between distances from input pins to transistors in parallel circuits 16 and 26, as seen in the embodiment shown in FIG. 5, can be compensated for. Thus, according to this embodiment, the operating conditions are aligned to a greater extent.

The circuit shown in FIG. 8 includes gate circuits 30 and 32 which differ from the circuit arrangement shown in FIG. 5 in that series circuits 13 and 23 are closer to voltage supply 5 and parallel circuits 16 and 26 are closer to ground. With this circuit arrangement, as the circuit arrangement shown in FIG. 5, operating conditions for input signals applied to input pins 1 and 2 can be aligned. In this circuit, too, by reversing the connections of the transistors in one of the two parallel circuits to input pins 1 and 2, the same effects in the circuit of FIG. 7 can be achieved.

Figure 9:
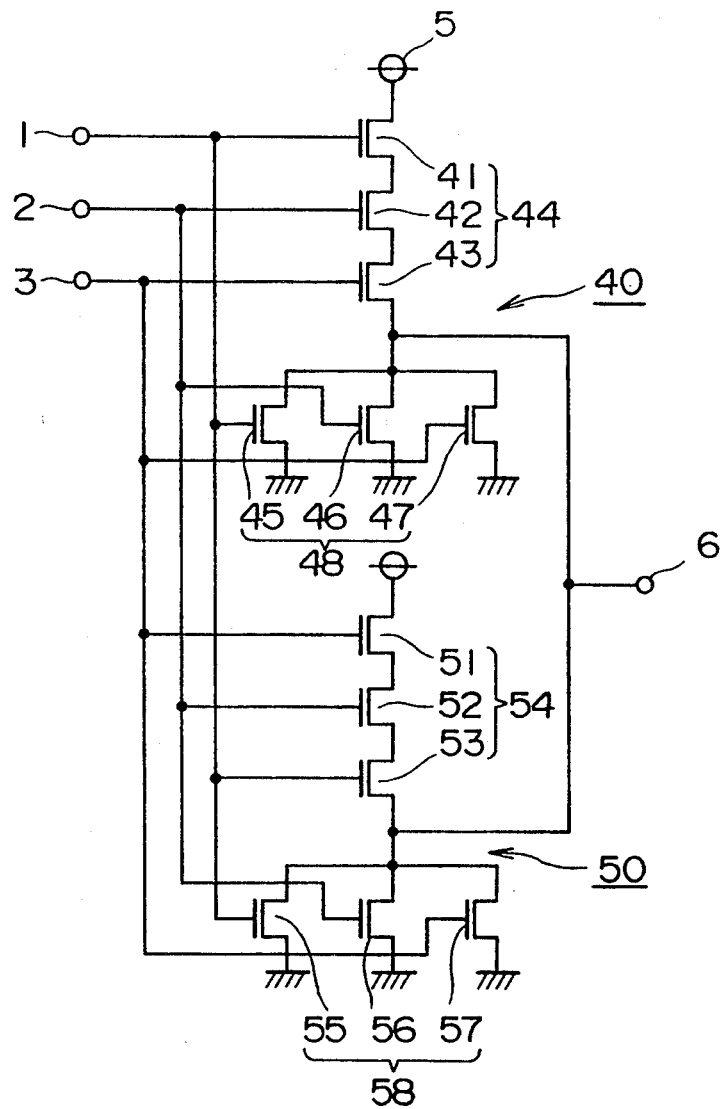
FIG. 9 shows a semiconductor logic circuit according to still another embodiment of the present invention which comprises two three-input gate circuits each including a series circuit comprising three transistors and a parallel circuit comprising three transistors.

The embodiment shown in FIG. 9 includes two three-input gate circuits 40 and 50. Three-input gate circuit 40 includes a series circuit 44 which comprises transistors 41, 42 and 43, and a parallel circuit 48 which comprises transistors 45, 46 and 47. Series circuit 44 is connected between a voltage supply 5 and an output pin 6, and parallel circuit 48 is connected between output pin 6 and ground. Similarly, three-input gate circuit 50 includes a series circuit 54 which comprises transistors 51, 52 and 53, and a parallel circuit 58 which comprises transistors 55, 56 and 57. Series circuit 54 is connected between voltage supply 5 and output pin 6, and parallel circuit 58 is connected between output pin 6 and ground. An input pin 1 is connected to the gate electrodes of transistors 41, 45, 53 and 55, an input pin 2 is connected to the gate electrodes of transistors 42, 46, 52 and 56, and an input pin 3 is connected to the gate electrodes of transistors 43, 47, 51 and 57.

The circuit of FIG. 9, if input pin 2 and transistors 41, 45, 53 and 55 were removed, would result in the circuit shown in FIG. 8. In a case where a series circuit comprises three transistors, as series circuits 44 and 54 of FIG. 9, the difference in operating conditions is relatively small between transistors 41 and 42, between transistors 42 and 43, between transistors 51 and 52, and between transistors 52 and 53, but it will be significant between uppermost transistor 41 and lowermost transistor 43 in series circuit 44 and between uppermost transistor 51 and lowermost transistor 53 in series circuit 54. Accordingly, the technique shown in FIG. 9 is to compensate for difference between the operating condition for input signal changes at input pin 1 and the operating condition for input signal changes at input pin 3, which could be caused by the difference in position of uppermost and lowermost transistors 41 and 43, and 51 and 53, by means of the technique shown in FIG. 8. Thus, the difference in operating condition can be minimized.

Figure 10:
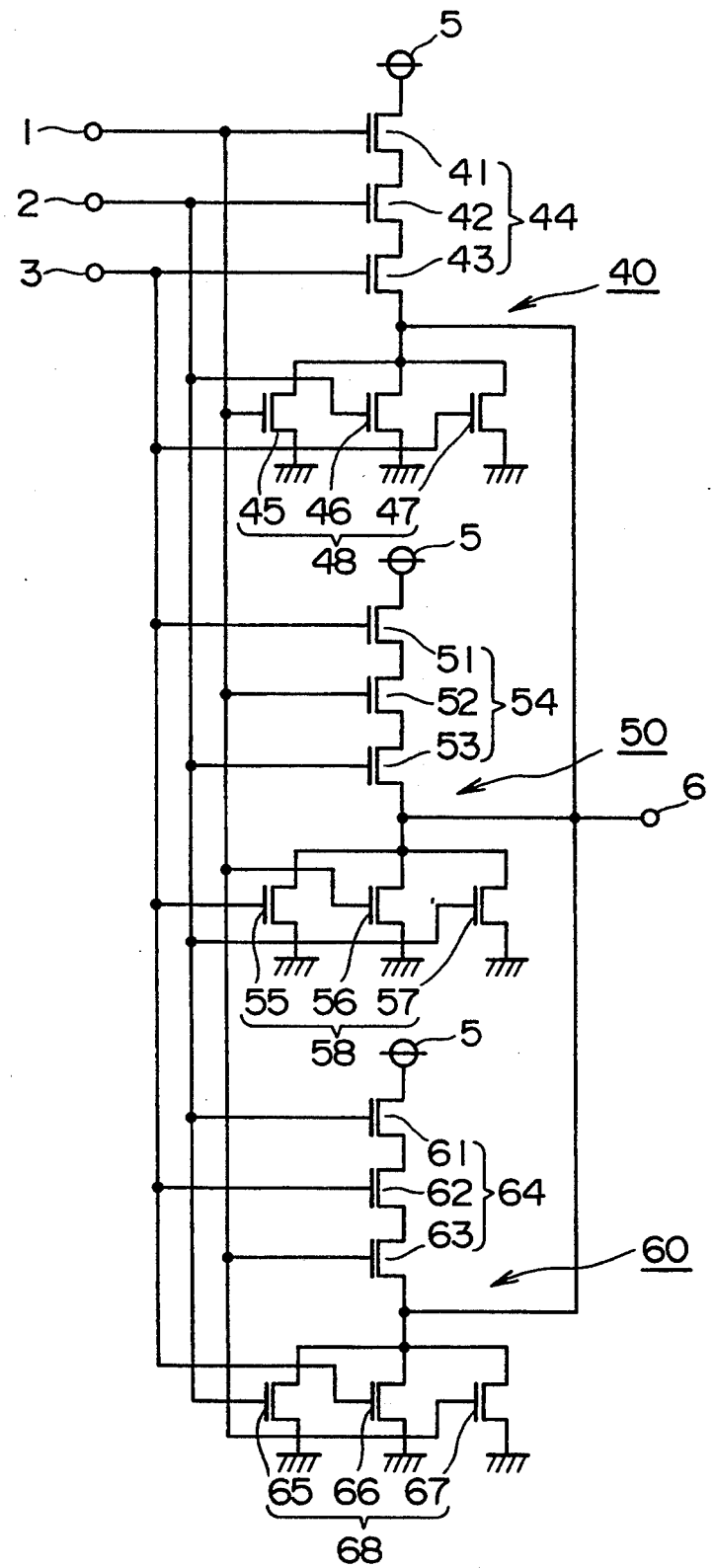
FIG. 10 shows a semiconductor logic circuit according to a further embodiment of the present invention which comprises three three-input gate circuits each including a series circuit comprising three transistors and a parallel circuit comprising three transistors.

FIG. 10 shows a semiconductor logic circuit according to another embodiment of the present invention. The circuit includes three three-input gate circuits 40, 50 and 60. Gate circuit 40 comprises a series circuit 44 including transistors 41, 42 and 43 connected in series between a voltage supply 5 and an output pin 6, and a parallel circuit 48 of transistors 45, 46 and 47 connected between output pin 6 and ground. Gate circuit 50 also comprises a series circuit 54 including transistors 51, 52 and 53 connected in series between voltage supply 5 and output pin 6, and a parallel circuit 58 of transistors 55, 56 and 57 connected between output pin 6 and ground. Similarly, gate circuit 60 also comprises a series circuit including transistors 61, 62 and 63 connected in series between voltage supply 5 and output pin 6, and a parallel circuit of transistors 65, 66 and 67 connected between output pin 6 and ground.

An input pin 1 is connected to the gate electrode of transistor 41 in series circuit 44 closest to voltage supply 5 and to the gate electrode of transistor 45 of parallel circuit 48 closest to input pin 1, in the gate circuit to the gate electrodes of center transistors 52 and 56 of the series and parallel circuits 54 and 58, respectively, of the gate circuit 50; and to the gate electrode of transistor 63 remotest from voltage supply 5 in series circuit 64 and to the gate electrode of transistor 67 remotest from pin 1 in parallel circuit 68, of gate circuit 60.

An input pin 2 is connected to the gate electrodes of center transistors 42 and 46 in series and parallel circuits 44 and 48, respectively, of gate circuit 40; to the gate electrode of transistor 53 remotest from voltage supply 5 in series circuit 54 and to the gate electrode of transistor 57 remotest from input pin 2 in parallel circuit 58, of gate circuit 50; and to the gate electrode of transistor 61 closest to voltage supply 5 in series circuit 64 and to the gate electrode of transistor 65 closest to input pin 2 in parallel circuit 68, of gate circuit 60.

Similarly, an input pin 3 is connected to the gate electrode of transistor 43 remotest from voltage supply 5 in series circuit 44 and to the gate electrode of transistor 47 remotest from input pin 3 in parallel circuit 48 of gate circuit 40; to the gate electrode of transistor 51 closest to voltage supply 5 in series circuit 54 and to the gate electrode of transistor 55 closest to input pin 3 in parallel circuit 58, of gate circuit 50; and to the gate electrodes of center transistors 62 and 66 in series and parallel circuits 64 and 68, respectively, of gate circuit 60.

As described in detail, in the semiconductor logic circuit shown in FIG. 10, each input pin is connected to one of the transistors closest to voltage supply 5, one of the center transistors, and one of the transistors remotest from voltage supply 5, of the three three-input gate circuits 40, 50 and 60, and, therefore, substantially no difference in operating condition results.

In addition, since similar considerations are given for connections to parallel circuits 48, 58 and 68 in the respective gate circuits, variations in operating conditions are further reduced.

As described in detail, according to the present invention, variations in response to input signal changes at different input pins of a multiple-input gate circuit including serially connected transistors of the same conductivity type can be reduced, the internal impedance of the circuit viewed from the output pin can be reduced, and, further, transistors in a gate array semiconductor integrated circuit can be efficiently utilized.

What is claimed is:

1. A semiconductor logic circuit comprising:
a plurality of multiple input gate circuits, each multiple input gate circuit including n inputs, a series circuit including n transistors of one conductivity type connected in series, and n transistors of a different conductivity type connected to said series circuit;
n input pins, each connected to one of said inputs; and
an output pin connected in common to each of said multiple input gate circuits;
a control electrode of a k-th transistor, in each series circuit at an end of that series circuit closer to a voltage supply input, being connected to a different one of said n input pins, where k is from 1 to n.

2. A semiconductor logic circuit according to claim 1, wherein said n transistors of a different conductivity type are connected in parallel to form a parallel circuit, said parallel circuit being connected in series with said series circuit.

3. A semiconductor logic circuit according to claim 1, wherein n is 2.

4. A semiconductor logic circuit according to claim 2, wherein a control electrode of an m-th transistor in each parallel circuit at an end closer to said n input pins is connected to a different one of said n input pins, where m is from 1 to n.

5. A semiconductor logic circuit comprising:
first and second multiple-input gate circuits each including first second and third inputs, a series circuit including first, second and third serially connected transistors of one conductivity type, and first, second and third transistors of a different conductivity type connected to said series circuit;
first, second and third input pins;
a control electrode of each of said first, second and third serially connected transistors, of sad first multiple-input gate circuit, being connected to a respective one of said first, second, and third input pins;
an output pin connected to a connection, between said series circuit and said first, second and third transistors of said different conductivity type, of each of said first and second multiple-input gate circuits; and
a control electrode of each of said first, second and third serially connected transistors, of said second multiple-input gate circuit, being connected to one of said third, second, and first input pins, respectively.

6. A semiconductor logic circuit according to claim 1 wherein n is 3.

7. A semiconductor logic circuit according to claim 2, wherein n is 3.

8. A semiconductor logic circuit according to claim 6 comprising:

control electrodes of first, second, and third transistors of said n transistors, of said series circuit of a first one of said plurality of multiple input gate circuits, connected to first, second and third ones of said n input pins, respectively; 'control electrodes of said first, second, and third transistors, of said series circuit of a second one of said plurality of multiple input gate circuits, connected to said third, first, and second ones of said n input pins, respectively; and control electrodes of said first, second, and third transistors, of said series circuit of a third one of said plurality of multiple input gate circuits, connected to said second, third, and first ones of said n input pins, respectively.

9. A semiconductor logic circuit according to claim 7 comprising:

control electrodes of said first, second, and third transistors, of said series circuit of a first one of said plurality of multiple input gate circuits, connected to first, second, and third ones of said n input pins, respectively;

control electrodes of said first, second, and third transistors, of said series circuit of a second one of said plurality of multiple input gate circuits, connected to said third, first and second ones of said n input pins, respectively; and control electrodes of said first, second, and third transistors, of said series circuit of a third one of said plurality of multiple input gate circuits connected to said second, third and first ones of said n input pins, respectively.

10. A semiconductor logic circuit according to claim 6 comprising:

control electrodes of first, second, and third transistors, of said n transistors of a different conductivity type of a first one of said plurality of multiple input gate circuits, connected to first, second, and third ones of said n input pins, respectively;

control electrodes of said first, second, and third transistors, of said n transistors of a different conductivity type of a second one of said plurality of multiple input gate circuits, connected to said third, first and second ones of said n input pins, respectively; and control electrodes of sad first, second, and third transistors, of said n transistors of a different conductivity type of a third one of said plurality of multiple input gate circuit, connected to said second, third, and first ones of said n input pins, respectively.

11. A semiconductor logic circuit according to claim 7 comprising:

control electrodes of first, second, and third transistors, of said parallel circuit of a first one of said plurality of multiple input gate circuits, connected to first, second, and third ones of said n input pins, respectively;

control electrodes of said first, second, and third transistors, of said parallel circuit of a second one of said plurality of multiple input gate circuits, connected to said third, first and second ones of said n input pins, respectively; and control electrodes of said first, second, and third transistors, of said parallel circuit of a third one of said plurality of multiple input gate circuits, connected to said second, third, ad first ones of said n input pins, respectively.

12. A semiconductor logic circuit according to claim 8 comprising:

control electrodes of first, second , and third transistors of said parallel circuit of said first one of said plurality of multiple input gate circuits, connected to first, second, and third ones of said n input pins, respectively;

control electrodes of said first, second, and third transistors, of said parallel circuit of said second one of said plurality of multiple input gate circuits, connected to said third, first and second ones of said n input pins, respectively; and control electrodes of said first, second, and third transistors, of said parallel circuit of said third one of said plurality of multiple input gate circuits, connected to said second, third, and first ones of said n input pins, respectively.

13. A semiconductor logic circuit according to claim 9 comprising:

control electrodes of first, second, and third transistors, of said parallel circuit of said first one of said plurality of multiple input gate circuits, connected to first, second, and third ones of said n input pins, respectively;

control electrodes of said first, second, and third transistors, of said parallel circuit of said second one of said plurality of multiple input gate circuits, connected to said third, first and second ones of said n input pins, respectively; and control electrodes of said first, second, and third transistors, of said parallel circuit of said third one of said plurality of multiple input gate circuits, connected to said second, third, and first ones of said n input pins, respectively.

14. A semiconductor logic circuit according to claim 1, wherein n is greater than 3.

15. A semiconductor logic circuit according to claim 2, wherein n is greater than 3.

16. A semiconductor logic circuit according to claim 4, wherein n is greater than 3.

17. A semiconductor logic circuit, disposed between a voltage supply and a ground, comprising:

a plurality of multi-input circuits;

a plurality of inputs connected to each of said multi-input circuits;

an output node;

said plurality of multi-input circuits including a plurality of transistors in series being one of p type and n type;

said plurality of multi-input circuits including a plurality of transistors in parallel being the other of p type and n type;

said plurality of transistors in series being disposed between said output node and one of said voltage supply and said ground;

said plurality of transistors in parallel being disposed between said output node and another of said voltage supply and said ground; and said plurality of inputs being uniquely connected to each of said plurality of multi-input circuits, wherein each $k^{th}$ transistor, of said plurality of transistors in series of each of said multi-input circuits, is connected to a different one of said plurality of inputs.

18. A semiconductor logic circuit according to claim 17, wherein said plurality of transistors in series and said plurality of transistors in parallel have an equal number of transistors.

19. A semiconductor logic circuit disposed between a voltage supply and a ground, comprising:
   a plurality of multi-input circuits having k inputs and an output node;
   said plurality of multi-input circuits including k transistor in series being one of p type and n type;
   said plurality of multi-input circuits including k transistors in parallel being the other of p type and n type;
   said k transistors in series being disposed between said output node and one of said voltage supply and said ground;
   said k transistors in parallel being disposed between said output node and another of said voltage supply and said ground; and
   each of said k inputs being uniquely connected to each of said plurality of multi-input circuits, wherein each $x^{th}$ transistor, of said k transistors in series of each of said multi-input circuits, is connected to a different one of said k inputs, were x is between 1 and k.

20. A semiconductor logic circuit according to claim 19, wherein k is 2.

21. A semiconductor logic circuit according to claim 19, wherein k is 3.

22. A semiconductor logic circuit according to claim 19, wherein a total number of said plurality of multi-input circuits is k.

23. A logic circuit for receiving a plurality, n, of inputs and producing an output, comprising:
   at least first and second input circuits;
   each of said first and second input circuits including n parallel transistors connected in parallel between a first reference voltage and said output;
   each of said at least first and second input circuits including n series transistors connected in series between said output and a second reference voltage;
   all of said n parallel transistors being of a first conductivity type;
   all of said n series transistors being of a second conductivity type;
   a first of said n inputs being connected to a one of said n serial transistors situated closest to sad second reference voltage in said first input circuit, and to a one of said n serial transistors further from said second reference voltage in said second input circuit; and
   a second of said n inputs being connected a second of said n serial transistors situated further from said second reference voltage in said first input circuit, and to a second one of said n serial transistors closest to said second reference voltage in said second input circuit.

24. Apparatus according to claim 23, wherein:
   n is 3; and
   a third of said n inputs being connected to one of said n serial transistors closest to said second reference voltage in a third input circuit.

25. Apparatus according to claim 23 wherein:
   said at least first and second input circuits include n input circuits; and
   each of said n inputs being connected to only a one of said n serial transistors situated closest to said second reference voltage in a single one of said n input circuits.

* * * * *